US010629351B2

(12) United States Patent
Saeki

(10) Patent No.: US 10,629,351 B2
(45) Date of Patent: Apr. 21, 2020

(54) SEMICONDUCTOR DEVICE, SEMICONDUCTOR CHIP, AND SYSTEM

(71) Applicant: SONY CORPORATION, Tokyo (JP)

(72) Inventor: Takanori Saeki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/073,479

(22) PCT Filed: Nov. 9, 2016

(86) PCT No.: PCT/JP2016/083256
§ 371 (c)(1),
(2) Date: Jul. 27, 2018

(87) PCT Pub. No.: WO2017/141505
PCT Pub. Date: Aug. 24, 2017

(65) Prior Publication Data
US 2019/0043649 A1 Feb. 7, 2019

(30) Foreign Application Priority Data

Feb. 16, 2016 (JP) .................. 2016-026472

(51) Int. Cl.
*H01F 17/00* (2006.01)
*H01F 27/00* (2006.01)
(Continued)

(52) U.S. Cl.
CPC ..... *H01F 17/0013* (2013.01); *H01F 27/2804* (2013.01); *H01F 38/14* (2013.01);
(Continued)

(58) Field of Classification Search
None
See application file for complete search history.

(56) References Cited

U.S. PATENT DOCUMENTS

2009/0244866 A1 10/2009 Kawano et al.
2011/0049693 A1* 3/2011 Nakashiba .............. H01L 23/48
257/676
(Continued)

FOREIGN PATENT DOCUMENTS

CN 101621065 A 1/2010
CN 102768897 A 11/2012
(Continued)

OTHER PUBLICATIONS

International Search Report and Written Opinion of PCT Application No. PCT/JP2016/083256, dated Jan. 24, 2017, 09 pages of ISRWO.

*Primary Examiner* — Tucker J Wright
*Assistant Examiner* — Scott Stowe
(74) *Attorney, Agent, or Firm* — Chip Law Group

(57) ABSTRACT

To inhibit a decrease in inductance of an inductor in a plurality of semiconductor chips that are stacked. A semiconductor device includes: first and second semiconductor chips that are stacked; a first inductor; an arrangement-restricted region; and a circuit. In the semiconductor device, the first inductor is arranged in the first semiconductor chip. The arrangement-restricted region is provided in a region of the second semiconductor chip corresponding to the first inductor. The circuit is arranged in a region of the second semiconductor chip not corresponding to the arrangement-restricted region.

13 Claims, 15 Drawing Sheets

(51) Int. Cl.
*H01L 27/146* (2006.01)
*H01L 27/04* (2006.01)
*H01F 27/28* (2006.01)
*H01F 38/14* (2006.01)
*H01L 49/02* (2006.01)

(52) U.S. Cl.
CPC .......... *H01L 27/04* (2013.01); *H01L 27/1469* (2013.01); *H01L 27/14634* (2013.01); *H01L 27/14636* (2013.01); *H01L 28/10* (2013.01); *H01F 2017/008* (2013.01); *H01F 2017/0073* (2013.01); *H01F 2038/143* (2013.01)

(56) References Cited

U.S. PATENT DOCUMENTS

| | | |
|---|---|---|
| 2012/0075050 A1 | 3/2012 | Kawano et al. |
| 2014/0333149 A1 | 11/2014 | Kawano et al. |
| 2015/0280785 A1* | 10/2015 | Brauchler ............ H04B 5/0018 257/531 |

FOREIGN PATENT DOCUMENTS

| | | |
|---|---|---|
| JP | 10-051691 A | 2/1998 |
| JP | 11-068033 A | 3/1999 |
| JP | 2005-217804 A | 8/2005 |
| JP | 2010-016142 A | 1/2010 |
| JP | 2010-278400 A | 12/2010 |
| TW | 201304287 A | 1/2013 |

* cited by examiner

FIG. 17

| TYPE OF SEMICONDUCTOR DEVICE | ABOVE LOWER INDUCTOR | SHAPE OF INDUCTOR |
|---|---|---|
| IMAGE SENSOR | DUMMY PATTERN | SINGLE-LAYER, CIRCULAR, ETC. |
| | | SINGLE-LAYER AND 8-SHAPED |
| | | MULTI-LAYER, CIRCULAR, ETC. |
| | | MULTI-LAYER AND 8-SHAPED |
| | INDUCTOR | SINGLE-LAYER, CIRCULAR, ETC. |
| | | SINGLE-LAYER AND 8-SHAPED |
| | | MULTI-LAYER, CIRCULAR, ETC. |
| | | MULTI-LAYER AND 8-SHAPED |
| | NO ARRANGEMENT | SINGLE-LAYER, CIRCULAR, ETC. |
| | | SINGLE-LAYER AND 8-SHAPED |
| | | MULTI-LAYER, CIRCULAR, ETC. |
| | | MULTI-LAYER AND 8-SHAPED |
| OTHER THAN IMAGE SENSOR | DUMMY PATTERN | SINGLE-LAYER, CIRCULAR, ETC. |
| | | SINGLE-LAYER AND 8-SHAPED |
| | | MULTI-LAYER, CIRCULAR, ETC. |
| | | MULTI-LAYER AND 8-SHAPED |
| | INDUCTOR | SINGLE-LAYER, CIRCULAR, ETC. |
| | | SINGLE-LAYER AND 8-SHAPED |
| | | MULTI-LAYER, CIRCULAR, ETC. |
| | | MULTI-LAYER AND 8-SHAPED |
| | NO ARRANGEMENT | SINGLE-LAYER, CIRCULAR, ETC. |
| | | SINGLE-LAYER AND 8-SHAPED |
| | | MULTI-LAYER, CIRCULAR, ETC. |
| | | MULTI-LAYER AND 8-SHAPED |

SEMICONDUCTOR DEVICE, SEMICONDUCTOR CHIP, AND SYSTEM

CROSS REFERENCE TO RELATED APPLICATIONS

This application is a U.S. National Phase of International Patent Application No. PCT/JP2016/083256 filed on Nov. 9, 2016, which claims priority benefit of Japanese Patent Application No. JP 2016-026472 filed in the Japan Patent Office on Feb. 16, 2016. Each of the above-referenced applications is hereby incorporated herein by reference in its entirety.

TECHNICAL FIELD

The present technology relates to semiconductor devices, semiconductor chips, and systems. More particularly, it relates to a semiconductor device, a semiconductor chip, and a system, which are provided with an inductor.

BACKGROUND ART

In related art, an oscillator circuit for generating a clock signal or the like has been used in a semiconductor device such as an image sensor. In one example, an image sensor provided with an LC oscillator circuit including an inductor and a capacitor is developed (e.g., see Patent Literature 1).

CITATION LIST

Patent Literature

Patent Literature 1: JP H10-51691A

DISCLOSURE OF INVENTION

Technical Problem

In the related art described above, however, the circuits are dispersed to a plurality of semiconductor chips that are stacked to reduce the mounting area. In this case, the inductance of the inductor is likely to decrease disadvantageously. In one example, the arrangement in which an inductor is provided in the lower semiconductor chip and another circuit is arranged above the inductor causes a counter-electromotive force due to the magnetic field generated in the upper circuit to occur in the inductor. This counter-electromotive force will decrease the inductance of the inductor. The decrease in the inductance is likely to reduce the signal quality of the circuit including the inductor. In one example, the resonance frequency of the LC resonance circuit including the inductor is likely to vary. Thus, it is desirable to prevent the decreases in the inductance of the inductor.

It is conceivable to provide an electromagnetic shield above the inductor to inhibit a decrease in the inductance, but the addition of the electromagnetic shield will increase the number of components, thereby increasing the cost. As described above, it is disadvantageously difficult for the image sensor described above to inhibit a decrease in inductance in the plurality of semiconductor chips that are stacked.

The present technology is made in view of such a situation, and it is intended to inhibit a decrease in inductance of an inductor in a plurality of semiconductor chips that are stacked.

Solution to Problem

The present technology has been devised to solve the above-described problem, a first aspect thereof is a semiconductor device including: first and second semiconductor chips that are stacked; a first inductor arranged in the first semiconductor chip; an arrangement-restricted region provided in a region of the second semiconductor chip corresponding to the first inductor; and a circuit arranged in a region of the second semiconductor chip not corresponding to the arrangement-restricted region. This produces an effect that the generation of the magnetic field in the direction opposite to the magnetic field generated by the first inductor is inhibited.

In addition, according to this first aspect, a dummy pattern including wiring of a predetermined pattern insulated from the circuit may be further included. The dummy pattern may be arranged in the arrangement-restricted region. This produces an effect that the dummy pattern allows the generation of the magnetic field in the direction opposite to the magnetic field generated by the first inductor to be inhibited.

In addition, according to this first aspect, a second inductor connected to the first inductor may be further included. The first and second inductors may generate individual magnetic fields in an identical direction. The second inductor may be arranged in the arrangement-restricted region. This produces an effect that the inductance of the first inductor is increased.

In addition, according to this first aspect, the second inductor may include wiring wound along a spiral path. This produces an effect that the inductance of the first inductor is increased by the second inductor wound in the spiral shape.

In addition, according to this first aspect, the second inductor may include first wiring wound clockwise from a predetermined start point to a predetermined connection point, and second wiring wound counterclockwise from the predetermined connection point to a predetermined end point. This produces an effect that the electromagnetic noise due to the magnetic field from the second inductor is reduced or eliminated.

In addition, according to this first aspect, the second inductor may include multilayer wiring. This produces an effect that the winding number of the second inductor is increased more than that of the single layer.

In addition, according to this first aspect, the first inductor may include wiring wound along a spiral path. This produces an effect that the generation of the magnetic field in the direction opposite to the magnetic field generated by the first inductor wound in the spiral shape is inhibited.

In addition, according to this first aspect, the first inductor may include first wiring wound clockwise from a predetermined start point to a predetermined connection point, and second wiring wound counterclockwise from the predetermined connection point to a predetermined end point. This produces an effect that the electromagnetic noise due to the magnetic field from the first inductor is reduced or eliminated.

In addition, according to this first aspect, the first inductor may include multilayer wiring. This produces an effect that the winding number of the first inductor is increased more than that of the single layer.

In addition, according to this first aspect, a capacitor configured to resonate with the first inductor may be further included. This produces an effect that an oscillation signal is generated.

In addition, according to this first aspect, the circuit may include a plurality of pixel circuits each of which generates a pixel signal. This produces an effect that an image is captured.

In addition, a second aspect of the present technology is a semiconductor chip including: an arrangement-restricted region provided in a region corresponding to a first inductor arranged in another semiconductor chip that is stacked; and a circuit arranged in a region not corresponding to the arrangement-restricted region.

This produces an effect that the generation of the magnetic field in the direction opposite to the magnetic field generated by the first inductor is inhibited.

In addition, a third aspect of the present technology is a system including: first and second semiconductor chips that are stacked; a first inductor arranged in the first semiconductor chip; an arrangement-restricted region provided in a region of the second semiconductor chip corresponding to the first inductor; and a circuit arranged in a region of the second semiconductor chip not corresponding to the arrangement-restricted region. This produces an effect that the generation of the magnetic field in the direction opposite to the magnetic field generated by the first inductor is inhibited.

Advantageous Effects of Invention

According to the present technology, it is possible to achieve an advantageous effect capable of inhibiting a decrease in inductance of an inductor in a plurality of semiconductor chips that are stacked. Note that the effects described herein are not necessarily limitative and any of the effects described in the present disclosure may be applied.

BRIEF DESCRIPTION OF DRAWINGS

FIG. 17 is a diagram that summarizes combinations of components in the embodiments of the present technology.

MODE(S) FOR CARRYING OUT THE INVENTION

Modes for carrying out the present technology (hereinafter referred to as embodiments) will be described below. The description is given in the following order.
1. First embodiment (an example of arranging a dummy pattern above an inductor)
2. Second embodiment (an example of arranging a dummy pattern above an inductor in a device other than an image sensor)
3. Third embodiment (an example of arranging an inductor above an inductor)
4. Fourth embodiment (an example of arranging an 8-shaped inductor above an 8-shaped inductor)
5. Fifth embodiment (an example of arranging a dummy pattern above an 8-shaped inductor)
6. Sixth embodiment (an example of arranging an 8-shaped inductor above an 8-shaped inductor in a device other than an image sensor)
7. Seventh embodiment (an example of arranging a stack type inductor above a stack type inductor)

<1. First Embodiment>

[Exemplary Configuration of Semiconductor Device]

Figure 1:
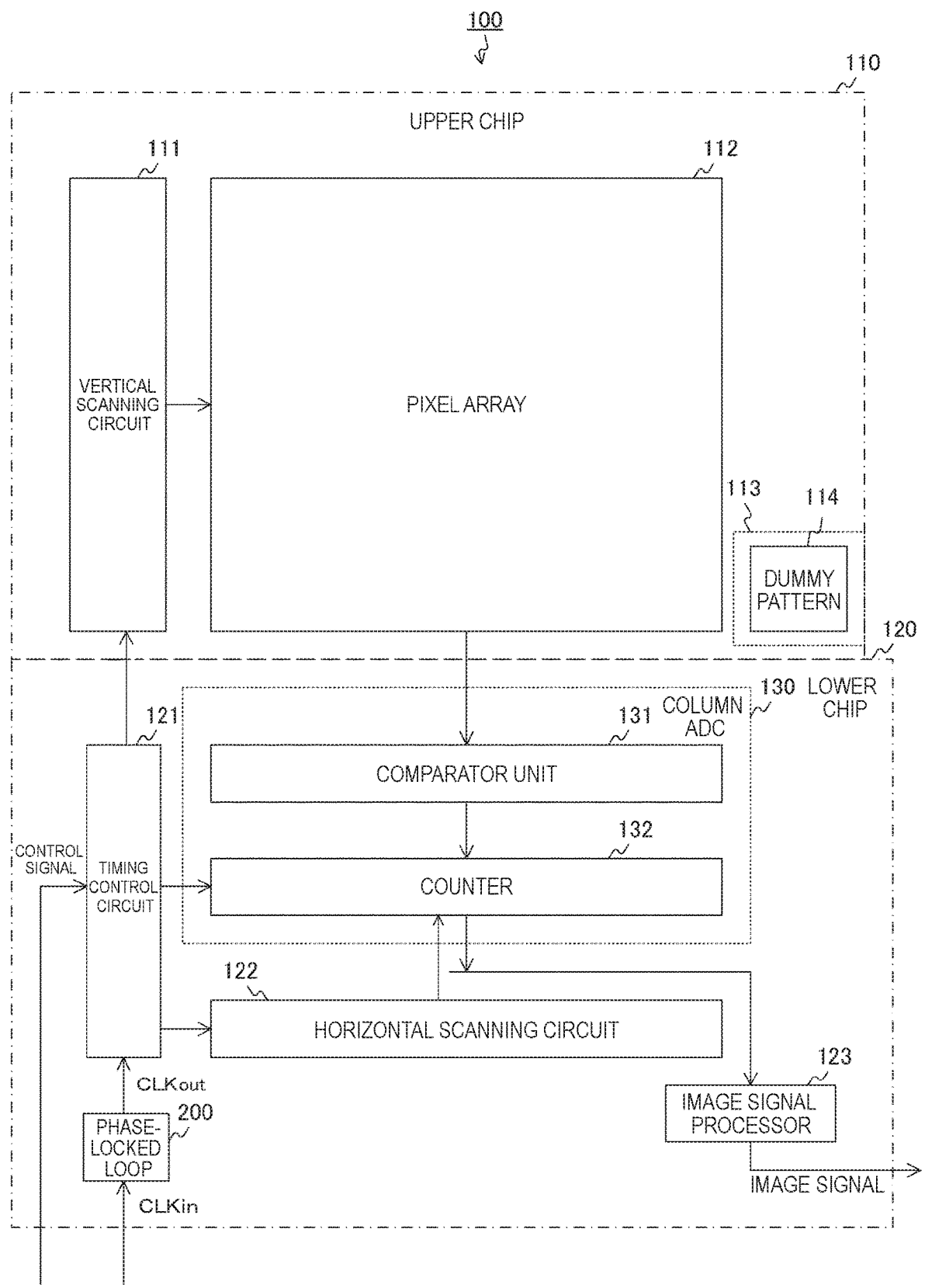
FIG. 1 is a block diagram illustrating an exemplary configuration of a semiconductor device according to a first embodiment of the present technology.

FIG. 1 is a block diagram illustrating an exemplary configuration of a semiconductor device 100 according to a first embodiment. The semiconductor device 100 includes a lower chip 120 and an upper chip 110 stacked on the lower chip 120. It is assumed that an image sensor or an imaging apparatus using the image sensor, or the like is used as the semiconductor device 100.

The upper chip 110 includes a vertical scanning circuit 111, a pixel array 112, an arrangement-restricted region 113, and a dummy pattern 114. The lower chip 120 includes a timing control circuit 121, a column analog-to-digital converter (ADC) 130, a horizontal scanning circuit 122, an image signal processor 123, and a phase-locked loop 200. The direction from the lower chip 120 to the upper chip 110 is defined as "above", hereinafter. Moreover, the upper chip 110 is an example of a second semiconductor chip set forth in the claims, and the lower chip 120 is an example of a first semiconductor chip set forth in the claims.

The pixel array 112 is provided with a plurality of pixel circuits arranged along the row and column directions. Each of the pixel circuits converts incident light into electricity to generate an analog pixel signal. In addition, the pixel array 112 is arranged in a region not corresponding to the arrangement-restricted region 113 of the upper chip 110. Moreover, the pixel circuit in the pixel array 112 is an example of a circuit set forth in the claims.

The arrangement-restricted region 113 is a region on the upper chip 110 where arrangement of various circuits, such as the vertical scanning circuit 111 and the pixel array 112, is restricted. This arrangement-restricted region 113 is provided in a region on the upper chip 110 corresponding to the inductor in the phase-locked loop 200, that is, a region above the inductor.

The timing control circuit 121 controls the respective circuits of the lower chip 120 and the upper chip 110. This timing control circuit 121, in one example, when receiving a control signal for directing the start of the imaging from the outside, generates a timing signal on the basis of a clock signal $CLK_{OUT}$ and supplies it to the vertical scanning circuit 111 and the horizontal scanning circuit 122. This timing signal indicates the timing of selecting rows or columns. In addition, the timing control circuit 121 generates a timing signal indicating the timing of analog-to-digital (AD) conversion and supplies it to the column ADC 130.

The phase-locked loop 200 generates the clock signal $CLK_{out}$ by multiplying a clock signal $CLK_{in}$ from the outside. This phase-locked loop 200 supplies the generated clock signal $CLK_{out}$ to the timing control circuit 121.

The vertical scanning circuit 111 sequentially selects the rows of the pixel array 112 under the control of the timing control circuit 121 and causes them to be exposed.

The column ADC 130 performs AD conversion on a pixel signal from the pixel array 112 for each column. The column ADC 130 includes a comparator unit 131 and a counter 132.

The comparator unit 131 compares the pixel signal with a predetermined ramp signal. The counter 132 counts a count value on the basis of a result of comparison by the comparator unit 131 under the control of the timing control circuit 121. In one example, the count value is counted in synchronization with the timing signal over a period until the level of the pixel signal exceeds the ramp signal. The counter 132 generates a digital signal indicating a count value for each column and supplies the digital signal to the image signal processor 123 under the control of the horizontal scanning circuit 122.

The horizontal scanning circuit 122 sequentially selects the columns under the control of the timing control circuit 121 and outputs the digital signals of the columns to the counter 132.

The image signal processor 123 performs predetermined signal processing on the digital signal from the pixels in the relevant column. In one example, correlated double sampling (CDS) processing for eliminating the pixel-specific fixed-pattern noise or analog-to-digital (AD) conversion processing is performed as signal processing. The image signal processor 123 outputs a signal composed of the processed digital signal as an image signal.

The dummy pattern 114 is wiring with a fixed pattern shape, which is insulated from a pixel circuit in the pixel array 112. The dummy pattern 114 is arranged in the arrangement-restricted region 113.

Moreover, although the vertical scanning circuit 111 and the like are provided on the upper chip 110 and the column ADC 130 and the like are provided on the lower chip 120, this arrangement is not limited to this exemplary configuration. In one example, the vertical scanning circuit 111 can be provided on the lower chip 120, and the comparator unit 131 can be provided on the upper chip 110. In addition, the column ADC 130 can be provided on the upper chip 110.

[Exemplary Configuration of Phase-Locked Loop]

Figure 2:
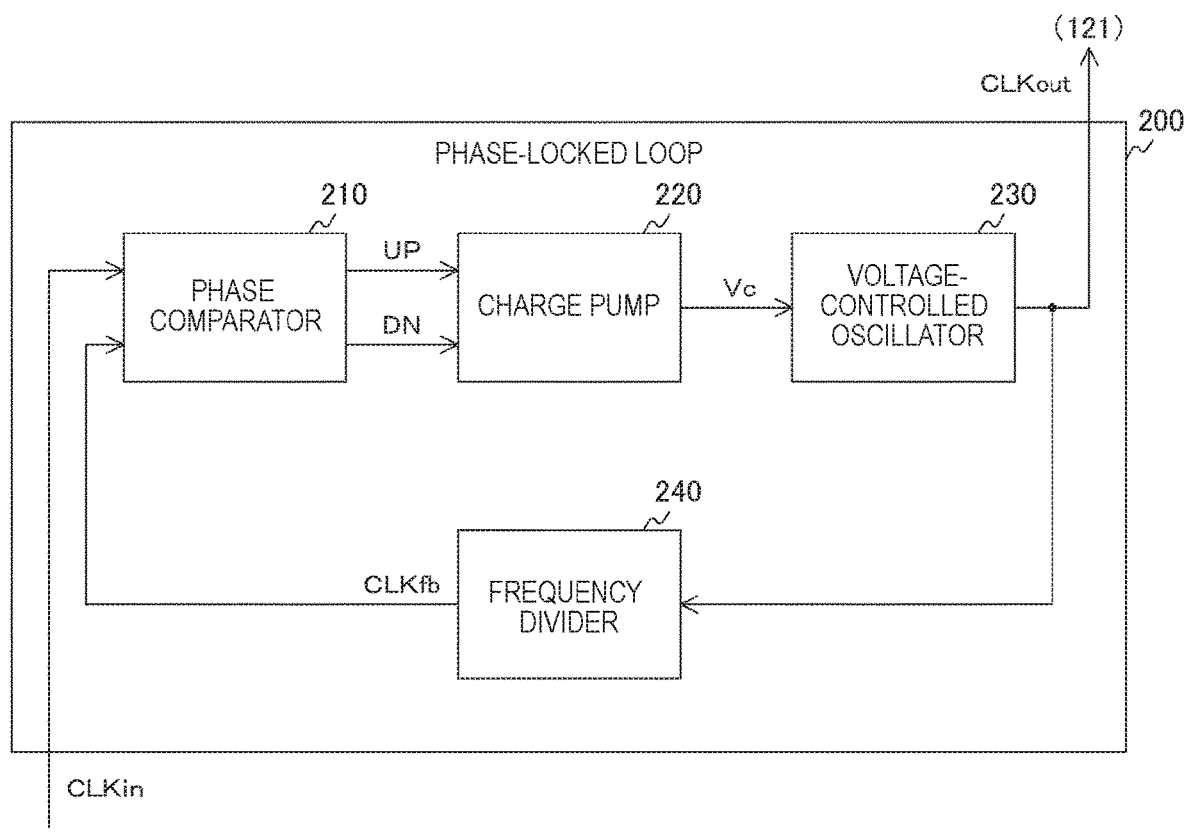
FIG. 2 is a block diagram illustrating an exemplary configuration of a phase-locked loop according to the first embodiment of the present technology.

FIG. 2 is a block diagram illustrating an exemplary configuration of the phase-locked loop 200 according to the first embodiment. The phase-locked loop 200 includes a phase comparator 210, a charge pump 220, a voltage-controlled oscillator 230, and a frequency divider 240.

The phase comparator 210 compares the phases of a clock signal $CLK_{in}$ and a clock signal $CLK_{fb}$ from the frequency divider 240. The phase comparator 210 generates detection signals UP and DN indicating the phase difference between these signals on the basis of the comparison result and supplies them to the charge pump 220. In one example, the difference between pulse widths of the detection signals UP and DN indicates the phase difference between the clock signal $CLK_{in}$ and the clock signal $CLK_{fb}$.

The charge pump 220 generates a control signal Vc of a voltage corresponding to the phase difference indicated by the detection signals UP and DN. The charge pump 220 supplies the control signal Vc to the voltage-controlled oscillator 230.

The voltage-controlled oscillator 230 generates a clock signal $CLK_{out}$ having a frequency corresponding to the voltage of the control signal Vc and supplies it to the frequency divider 240 and the timing control circuit 121.

The frequency divider 240 divides the frequency of the clock signal $CLK_{out}$ from the voltage-controlled oscillator 230 at a predetermined frequency division ratio. The frequency divider 240 feeds back the frequency-divided signal to the phase comparator 210 as the clock signal $CLK_{fb}$. In this way, the feedback of the signal obtained by dividing the frequency of the clock signal $CLK_{out}$ from the voltage-controlled oscillator 230 makes it possible for the phase-locked loop 200 to generate a signal obtained by multiplying the clock signal $CLK_{in}$.

[Exemplary Configuration of Voltage-Controlled Oscillator]

Figure 3:
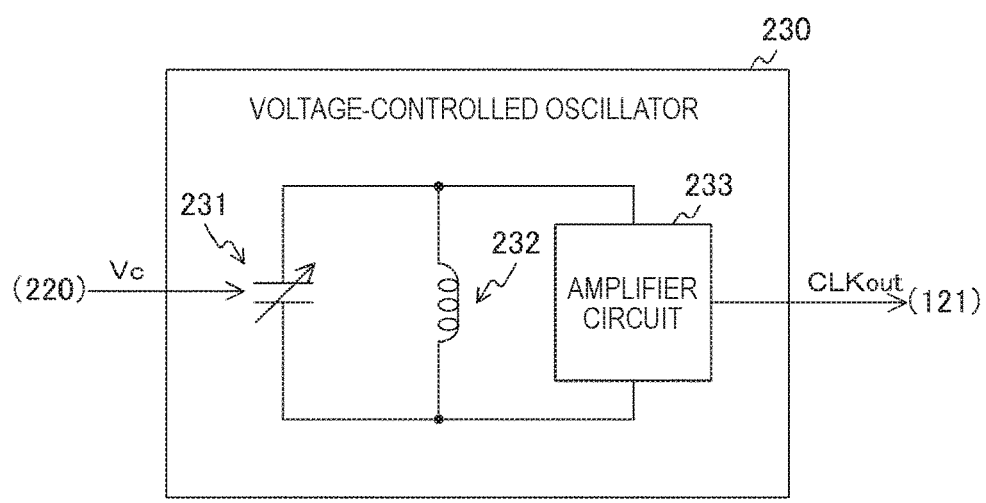
FIG. 3 is a circuit diagram illustrating an exemplary configuration of a voltage-controlled oscillator according to the first embodiment of the present technology.

FIG. 3 is a circuit diagram illustrating an exemplary configuration of the voltage-controlled oscillator 230 according to the first embodiment. The voltage-controlled oscillator 230 includes a variable capacitor 231, an inductor 232, and an amplifier circuit 233.

The variable capacitor 231 is a capacitor whose capacitance varies depending on the voltage of the control signal Vc from the charge pump 220. In one example, a varicap diode is used as the variable capacitor 231.

The inductor 232 resonates with the variable capacitor 231 to generate a clock signal. In addition, the inductor 232 generates a magnetic field in an upward direction or a downward direction. Moreover, the inductor 232 is an example of a first inductor set forth in the claims.

The amplifier circuit 233 amplifies a signal generated by the LC resonance circuit including the variable capacitor 231 and the inductor 232 and supplies the amplified signal to the timing control circuit 121 as the clock signal $CLK_{out}$.

Moreover, although the inductor 232 is arranged in the voltage-controlled oscillator 230, the inductor 232 can be arranged in a circuit (a buffer circuit, a clock distribution circuit, etc.) other than the voltage-controlled oscillator 230.

Figure 4:
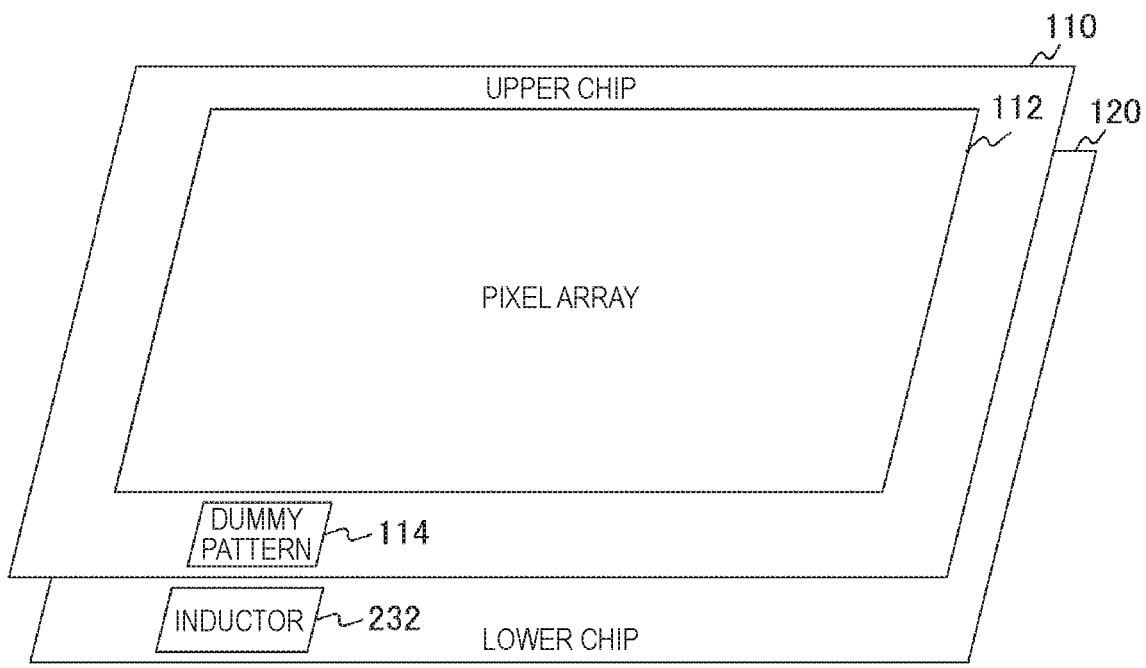
FIG. 4 is an example of a perspective view of the semiconductor device according to the first embodiment of the present technology.

FIG. 4 is an example of a perspective view of the semiconductor device according to the first embodiment. The upper chip 110 is stacked above the lower chip 120. In addition, in the upper chip 110, the pixel circuit is not provided in the arrangement-restricted region 113 above the inductor 232, and the dummy pattern 114 is arranged instead.

Here, if the pixel circuit is arranged above the inductor 232, the electromagnetic noise due to the magnetic field from the inductor 232 is likely to occur in the pixel circuit. In addition, a magnetic field in the direction opposite to the magnetic field from the inductor 232 is generated by the current induced in the pixel circuit due to the magnetic field from the inductor 232. This magnetic field in the opposite direction causes a counter-electromotive force in the inductor 232, thereby decreasing the inductance. The decrease in the inductance will deteriorate the signal quality of the clock signal from the phase-locked loop 200 including the inductor 232.

In the semiconductor device 100, however, the dummy pattern 114 is arranged in the arrangement-restricted region 113 above the inductor 232, so almost no magnetic field in the direction opposite to the magnetic field generated by the inductor 232 is generated. Thus, it is possible to inhibit a decrease in the inductance of the inductor 232. In addition, the pixel circuit is arranged in a region other than a region above the inductor 232, so it is possible to reduce or eliminate the electromagnetic noise occurring in the pixel circuit due to the magnetic field from the inductor 232.

Figure 5A:
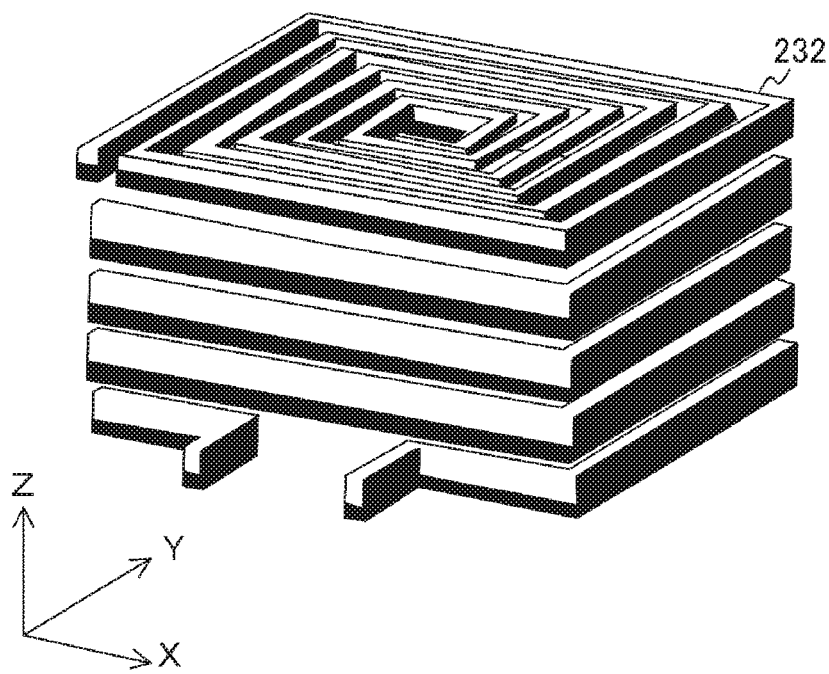
FIGS. 5A and 5B are examples of perspective and plan views of an inductor according to the first embodiment of the present technology.
Figure 5B:
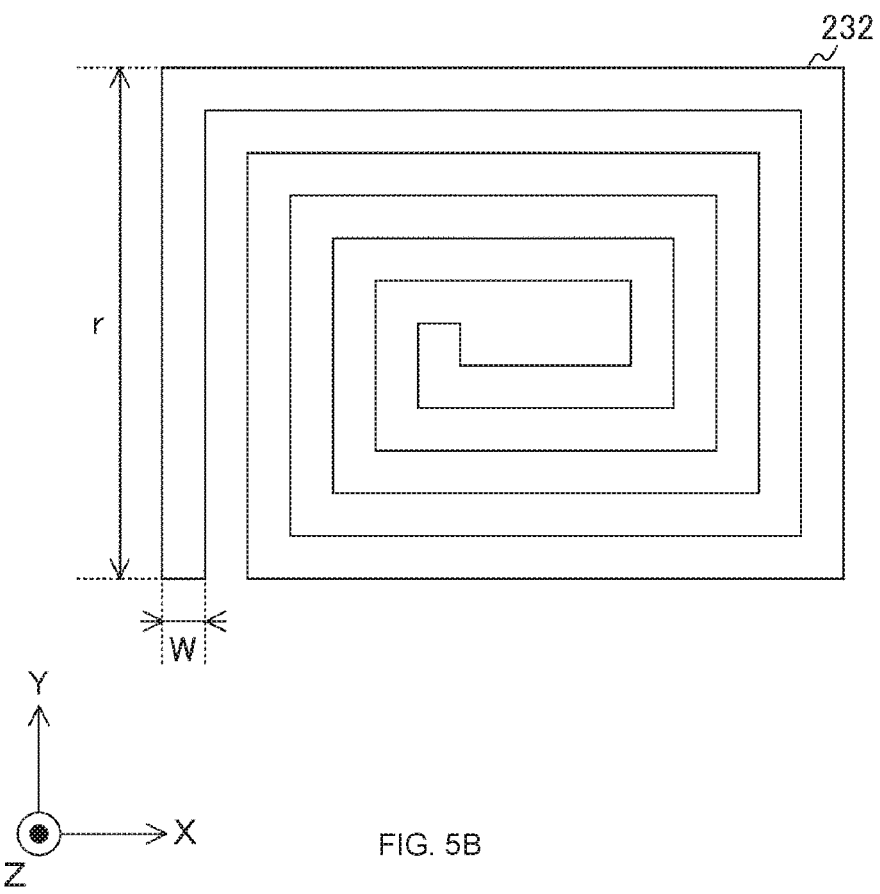

FIGS. 5A and 5B are examples of perspective and plan views of the inductor 232 according to the first embodiment. FIG. 5A is an example of a perspective view of the inductor 232, and FIG. 5B is an example of a plan view of the inductor 232 as viewed from above or below. As illustrated in the perspective view and the plan view, the inductor 232 includes multilayer wiring. In each layer, the wiring is wound clockwise or counterclockwise along a spiral path around a central axis parallel to the Z-axis. Here, the Z-axis is an axis perpendicular to the lower chip 120. In addition, the planar shape of the inductor 232 as viewed from above is rectangular (square or oblong). The upper chip 110 is further stacked above the lower chip 120 on which the multilayer inductor 232 is arranged. Moreover, the planar shape is not limited to a rectangle, and may be circular or elliptical. In addition, although the upper chip 110 and the lower chip 120 are provided in one semiconductor device 100, these chips may be dispersed in a plurality of devices in the system.

Here, the planar shape of the inductor 232 is set as a square and the length of one side thereof is set as r/4. In addition, when the inductor 232 has a two-layer structure and the number of turns is N, the inductance L of the inductor 232 is expressed by the following equation. The unit of r is, in one example, meters (m), and the unit of the inductance L is, in one example, Henry (H).

$$L \propto (r/4) \cdot (2N) = rN^2 \qquad \text{Formula 1}$$

Further, the Q value of the inductor 232 is expressed by the following equation, where W is the wiring width. The unit of the wiring width W is, in one example, meters (m).

$$Q = (2\pi f L)/R \propto 2\pi f N W \qquad \text{Formula 2}$$

In Formula 2, f is the resonance frequency and its unit is, in one example, Hertz (Hz). In addition, R is the internal resistance of the inductor 232 and is expressed by the following equation. The unit of R is, in one example, ohm (Ω).

$$R \propto (r/4) \cdot 2N \cdot (2/W) = rN/W$$

As exemplified by Formula 2, the Q value varies with a decrease in the inductance L. In addition, the inductor 232 formed in the multilayer structure allows the number of turns N to be larger than in the case of a single-layer structure. This increase in the number of turns N allows the inductance L and the Q value to be more improved than those of Formulas 1 and 2. The inductance L increases with the square of the number of layers.

Figure 6:
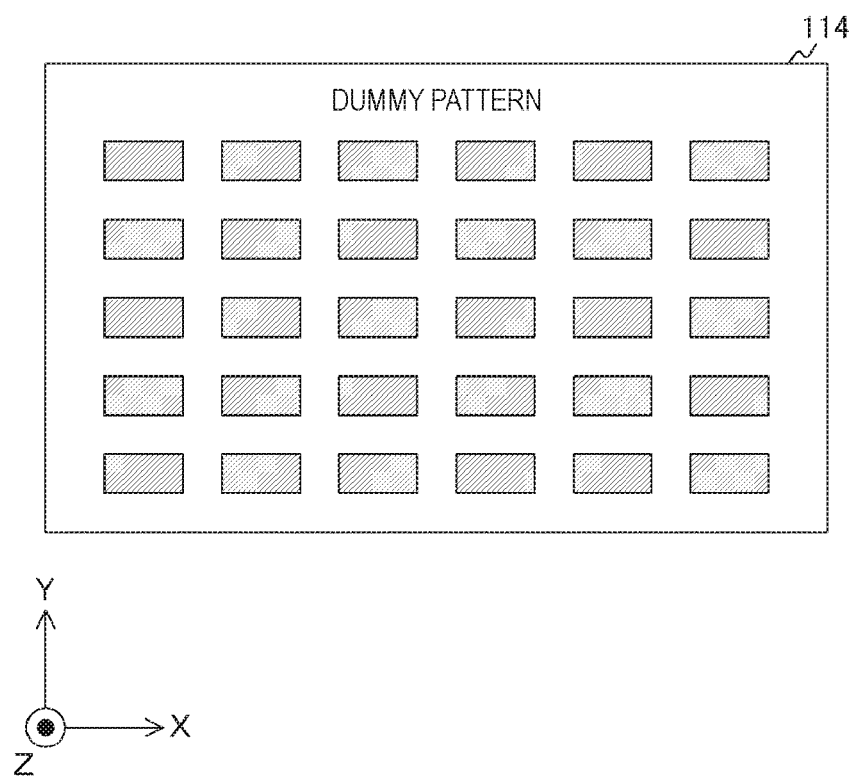
FIG. 6 is an example of a dummy pattern according to the first embodiment of the present technology.

FIG. 6 is an example of the dummy pattern 114 according to the first embodiment. In this figure, shaded portions indicate the wiring. In the dummy pattern 114, in one example, a plurality of wiring patterns, which are insulated from each other, are arranged in a two-dimensional lattice pattern. These wiring patterns are not connected, so the eddy current due to the magnetic field from the inductor 232 hardly occurs and the eddy current does not cause the magnetic field. Moreover, the pattern shape of the dummy pattern 114 is not limited to the pattern shape illustrated in this figure as long as it does not generate the magnetic field in the direction opposite to the magnetic field from the inductor 232.

In this way, according to the first embodiment of the present technology, the dummy pattern 114 is arranged in the arrangement-restricted region above the inductor 232, and the pixel array 112 and the like are arranged in the other regions. Thus, it is possible to inhibit the generation of the magnetic field in the direction opposite to the magnetic field from the inductor 232. This makes it possible to inhibit a decrease in the inductance of the inductor 232. In addition, it is possible to reduce or eliminate the electromagnetic noise occurring in the pixel circuit due to the magnetic field from the inductor 232.

[Modification]

In the first embodiment described above, the dummy pattern 114 is provided above the inductor 232, but a minute eddy current is generated in the wiring of the dummy pattern 114 in some cases. This eddy current may cause a decrease in the inductance of the inductor 232 although it is slight. The modification of the first embodiment is different from the first embodiment in that the decrease in the inductance is completely inhibited.

Figure 7:
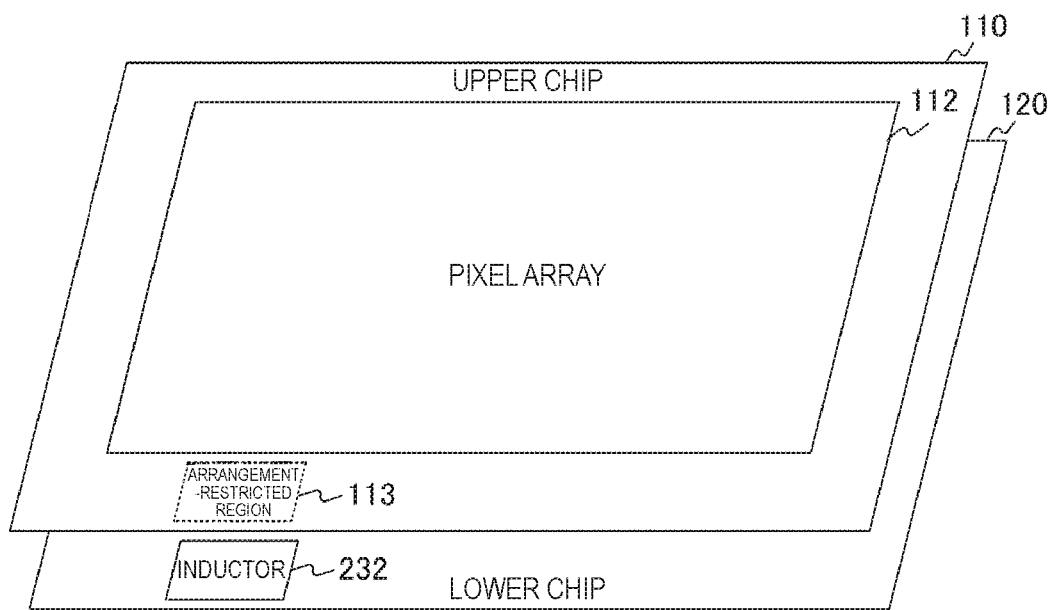
FIG. 7 is an example of a perspective view of a semiconductor device according to a modification of the first embodiment of the present technology.
Figure 7:

FIG. 7 is an example of a perspective view of a semiconductor device 100 according to the modification of the first embodiment. The upper chip 110 according to the modification of the first embodiment is different from that of the first embodiment in that the dummy pattern 114 is not arranged in the arrangement-restricted region 113. Neither the pixel circuit nor the dummy pattern 114 is provided in the arrangement-restricted region 113 above the inductor 232, so the magnetic field in the direction opposite to the magnetic field from the inductor 232 is not generated upward. It is possible to inhibit completely a decrease in the inductance of the inductor 232.

However, when the area of the inductor 232 is increased, the arrangement-restricted region 113 having no wiring is also increased accordingly, so the exposure density between the wired region and the non-wired region is lack of uniformity when the wiring is formed by a photoresist. This leads to lack of uniformity of the etching rate of these regions, so it may be difficult to form the wiring pattern of an accurate shape. Thus, it is desirable that the area of the inductor 232 be as small as possible.

In this way, according to the modification of the first embodiment of the present technology, the pixel array 112 and the like are arranged in a region not corresponding to the arrangement-restricted region above the inductor 232. Thus, it is possible to inhibit the generation of the magnetic field in the direction opposite to the magnetic field from the inductor 232. This makes it possible to inhibit completely a decrease in the inductance of the inductor 232.

<2. Second Embodiment>

In the first embodiment described above, the inductor 232 is arranged in the image sensor, but the inductor 232 can be arranged in a device that is not the image sensor or the like. A semiconductor device 100 according to a second embodiment is different from that of the first embodiment in that an inductor is provided in a device other than the image sensor.

Figure 8:
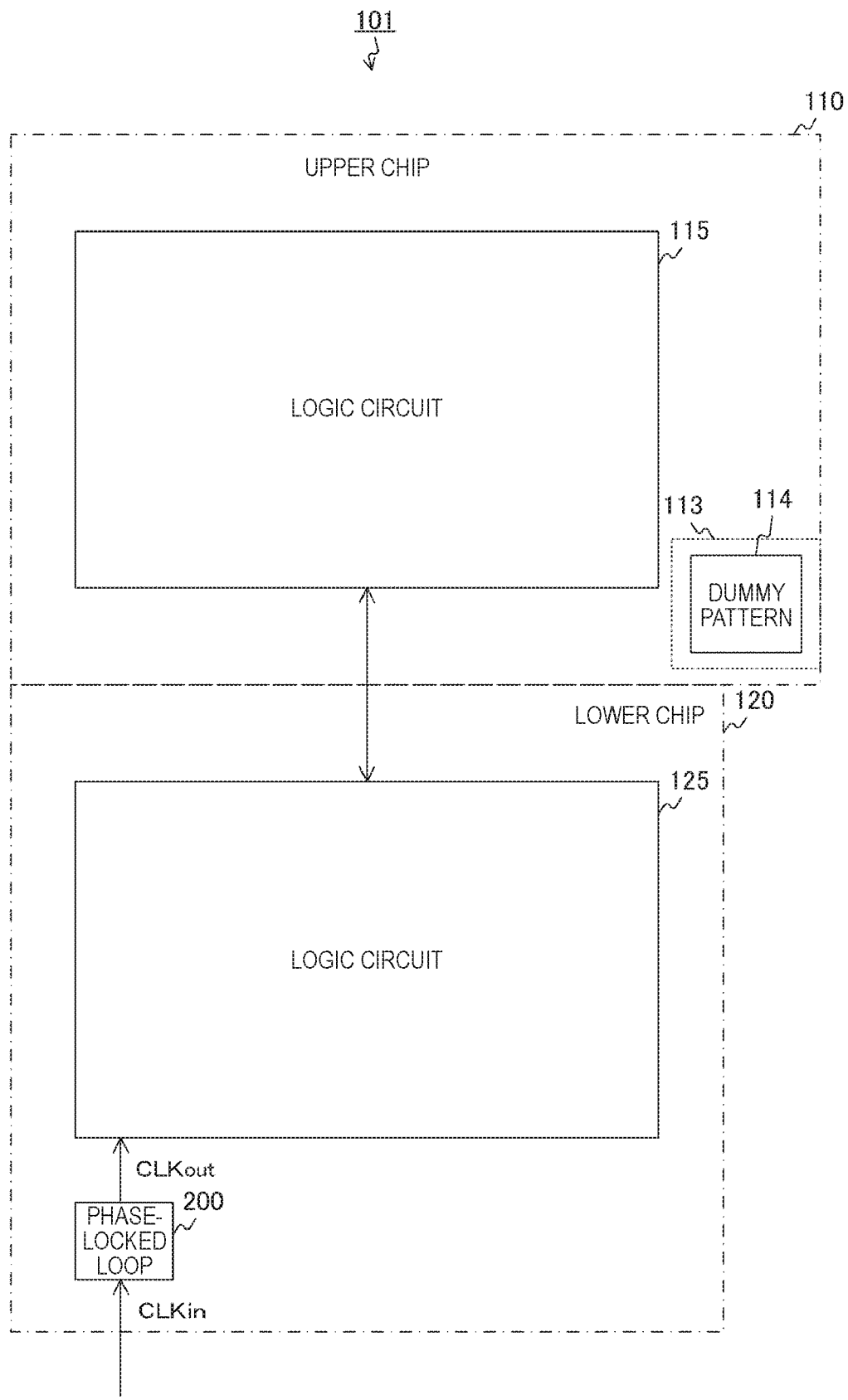
FIG. 8 is a block diagram illustrating an exemplary configuration of a semiconductor device according to a second embodiment of the present technology.

FIG. 8 is a block diagram illustrating an exemplary configuration of the semiconductor device 100 according to the second embodiment. The second embodiment is different from the first embodiment in that the semiconductor device 100 includes a circuit other than the image sensor. In this semiconductor device 100, the upper chip 110 is provided with a logic circuit 115 instead of the vertical scanning circuit 111 and the pixel array 112. In addition, in the lower chip 120, a logic circuit 125 is provided instead of the timing control circuit 121, the column ADC 130, the horizontal scanning circuit 122, and the image signal processor 123. The logic circuit 115 and the logic circuit 125 are circuits that execute various types of processing.

Figure 9A:
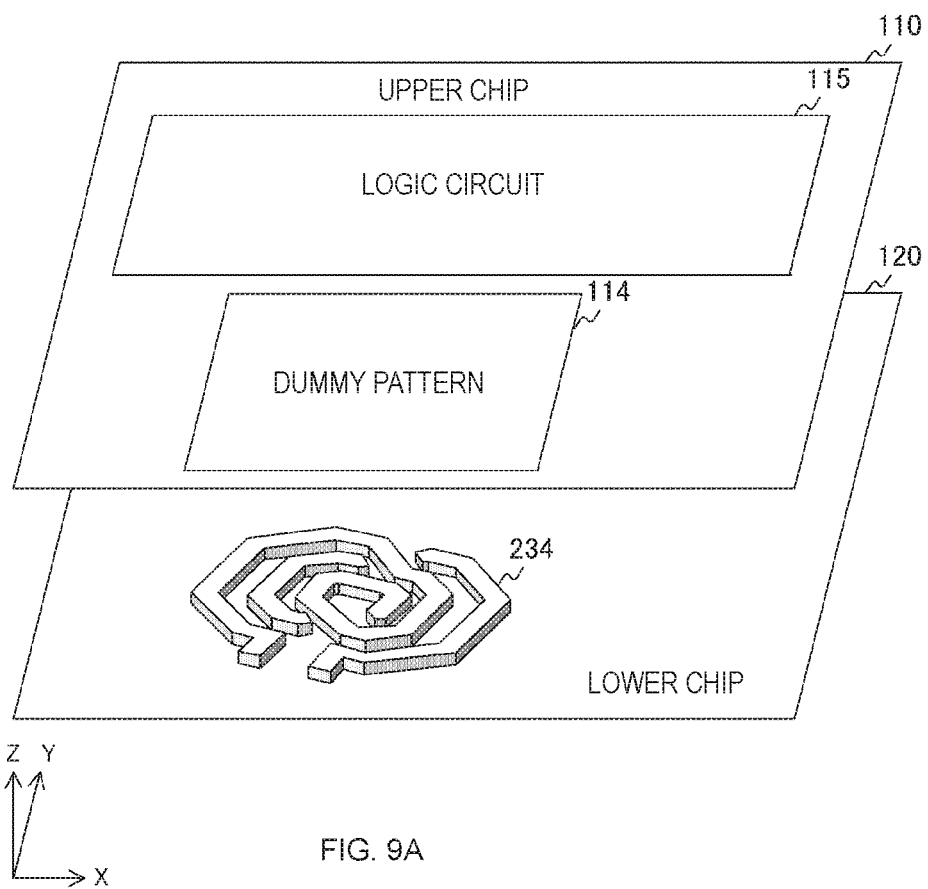
FIGS. 9A and 9B are examples is an example of a perspective view of the semiconductor device and a plan view of an inductor according to the second embodiment of the present technology.
Figure 9B:
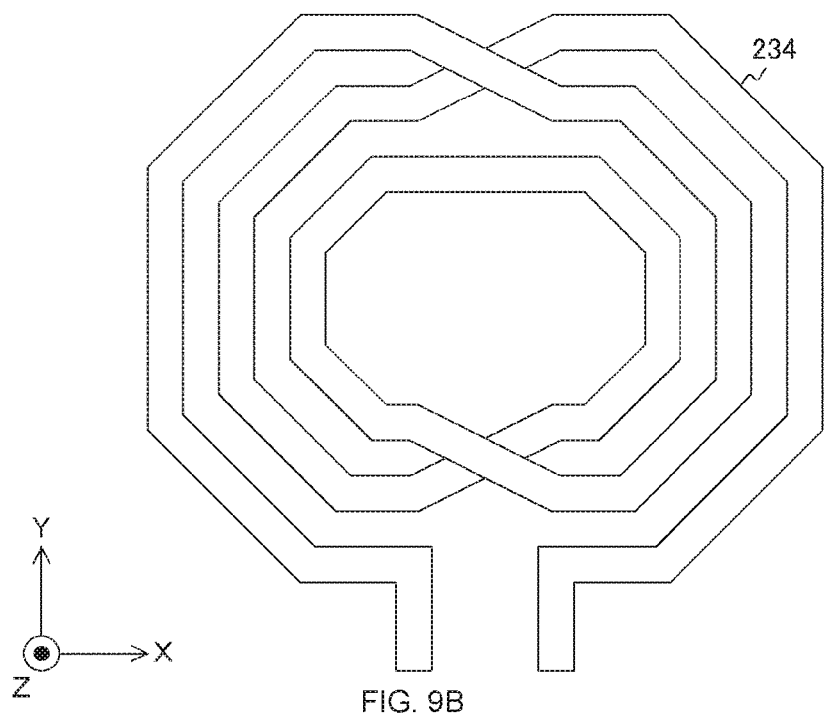

FIGS. 9A and 9B are examples of a perspective view of the semiconductor device 100 and a plan view of the inductor according to the second embodiment. FIG. 9A is an example of a perspective view of the semiconductor device 100. In the lower chip 120 according to the second embodiment, an inductor 234 is arranged instead of the inductor 232. FIG. 9B is an example of a plan view of the inductor 234. As illustrated in this figure, the inductor 234 is a single-layered, circular inductor unlike the multilayered and rectangular inductor 232 according to the first embodiment. This single-layered structure makes it necessary to cause the area of the inductor 234 to be larger than that in the first embodiment in order that the characteristics of inductance or the like may be equivalent to those in the first embodiment by Formula 1. In addition, it is necessary to increase the area of the arrangement-restricted region 113 and the dummy pattern 114 to be arranged above the inductor 234 depending on the area of the inductor 234.

In this way, according to the second embodiment of the present technology, the inductor 234 is provided in a device other than the image sensor and the dummy pattern 114 is arranged in the arrangement-restricted region above the inductor 234. Thus, it is possible to inhibit the generation of the magnetic field in the direction opposite to the magnetic field from the inductor 232. This makes it possible to inhibit a decrease in the inductance of the inductor 234 in a device other than the image sensor.

<3. Third Embodiment>

In the second embodiment described above, the dummy pattern 114 is provided above the inductor 234, but a minute eddy current may be generated in the wiring of the dummy pattern 114. This eddy current may cause a decrease in the inductance of the inductor 234 although it is slight. A semiconductor device 100 according to a third embodiment is different from that of the second embodiment in that it not only inhibits a decrease in inductance but also increases the inductance.

Figure 10:
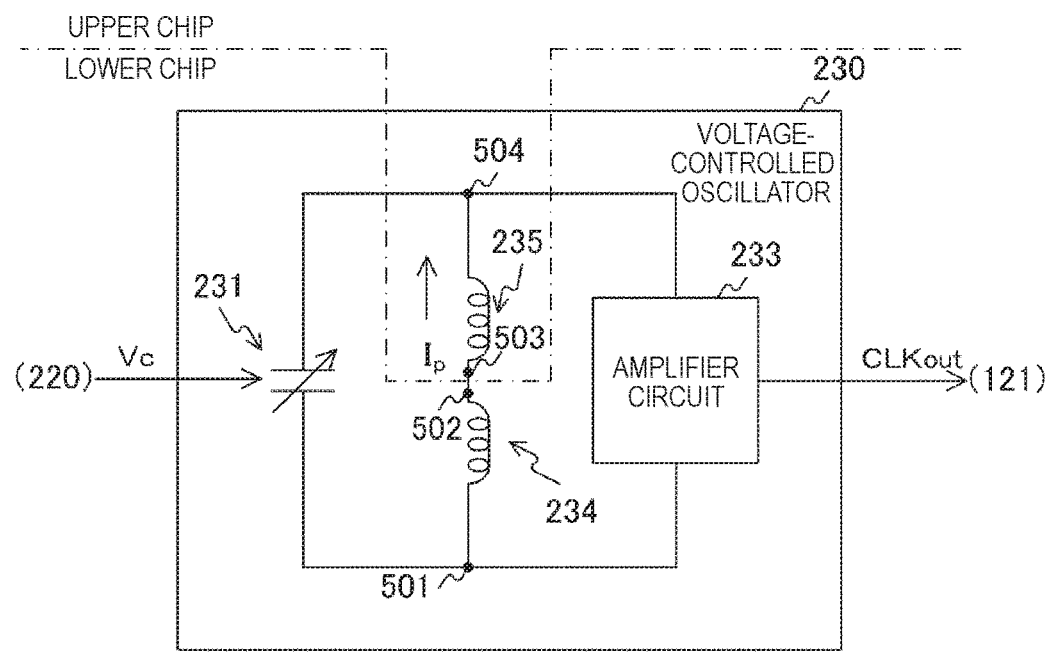
FIG. 10 is a circuit diagram illustrating an exemplary configuration of a voltage-controlled oscillator according to a third embodiment of the present technology.

FIG. 10 is a circuit diagram illustrating an exemplary configuration of a voltage-controlled oscillator 230 according to the third embodiment. The voltage-controlled oscillator 230 according to the third embodiment is different from that of the second embodiment in that it further includes an inductor 235.

The inductor 234 has two terminals 501 and 502. The one terminal 501 is connected to the variable capacitor 231 and the amplifier circuit 233, and the other terminal 502 is connected to the inductor 235. In addition, the inductor 235 has two terminals 503 and 504. The one terminal 503 is connected to the inductor 234 and the other terminal 504 is connected to the variable capacitor 231 and the amplifier circuit 233. In other words, the inductor 235 is connected in series with the inductor 234 between the two poles of the variable capacitor 231. Moreover, the inductor 235 is an example of a second inductor set forth in the claims.

Further, the inductor 235 is arranged on the upper chip 110. In other words, circuits or components in the voltage-controlled oscillator 230 are dispersed over the upper chip 110 and the lower chip 120. When the chips having circuits dispersed thereon as described above are bonded together, in one example, the method available at webpage "http://imager.no-mania.com/Entry/133/" is used. Here, wafers are bonded to each other without using a trough-silicon via (TSV) by forming chemical bonds using plasma.

The circuits or components in the voltage-controlled oscillator 230 are dispersed over the upper and lower chips, so it is possible to reduce the mounting area while maintaining the performance, as compared with the second embodiment in which the circuits or the like are not dispersed over the upper and lower chips. Alternatively, the performance can be improved while keeping the mounting area the same.

Figure 11:
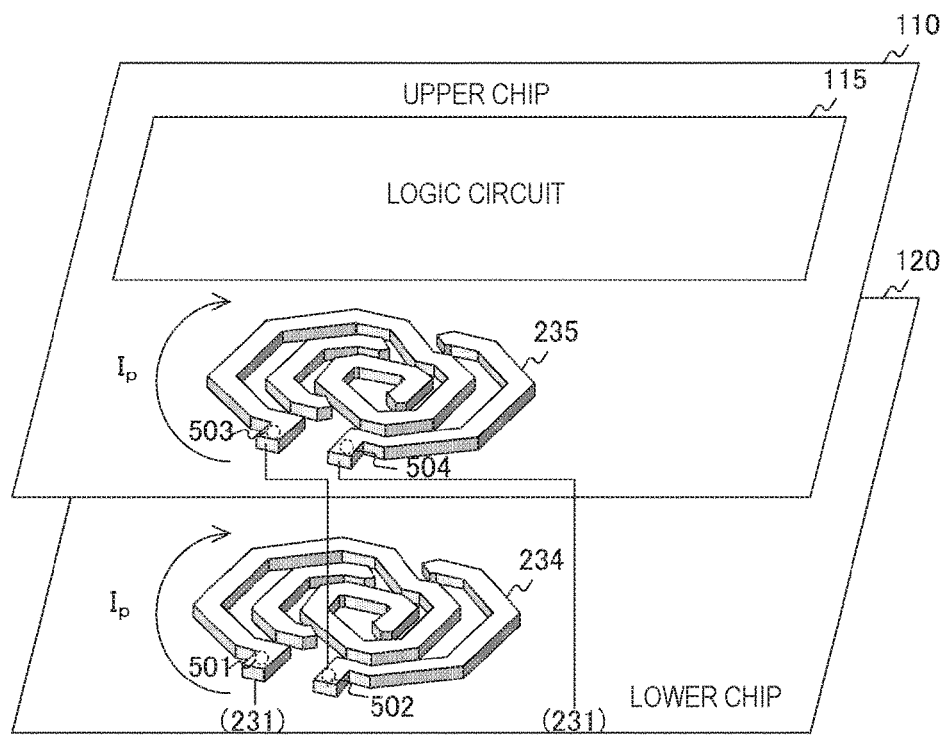
FIG. 11 is an example of a perspective view of a semiconductor device according to the third embodiment of the present technology.

FIG. 11 is an example of a perspective view of the semiconductor device 100 according to the third embodiment. As illustrated in this figure, the inductor 235, which is connected in series to the inductor 234, is arranged in the arrangement-restricted region above the inductor 234. The winding directions of these inductors 234 and 235 are identical, and these inductors generate respective magnetic fields in the same direction along the Z-axis. The induced electromotive force due to the magnetic field from the upper inductor 235 allows the inductance of the lower inductor 234 to be improved as compared with the case where the inductor 235 is not provided.

As described above, according to the third embodiment of the present technology, the inductor 235 that generates a magnetic field in the same direction as the inductor 234 is provided above the inductor 234, so the inductance of the inductor 234 can be made higher than in the case where the inductor 235 is not provided.

<4. Fourth Embodiment>

In the third embodiment described above, the pixel array 112 is arranged in a region other than the arrangement-restricted region 113 to reduce or eliminate the electromagnetic noise due to the magnetic field from the inductor 234 or the inductor 235. However, the stronger the magnetic field of the inductors 234 and 235, the more difficult it is to reduce or eliminate the electromagnetic noise. Thus, it is desirable to reduce the electromagnetic noise by changing the shape of the inductor itself. A semiconductor device 100 according to a fourth embodiment is different from that of the third embodiment in that the electromagnetic noise is reduced.

Figure 12:
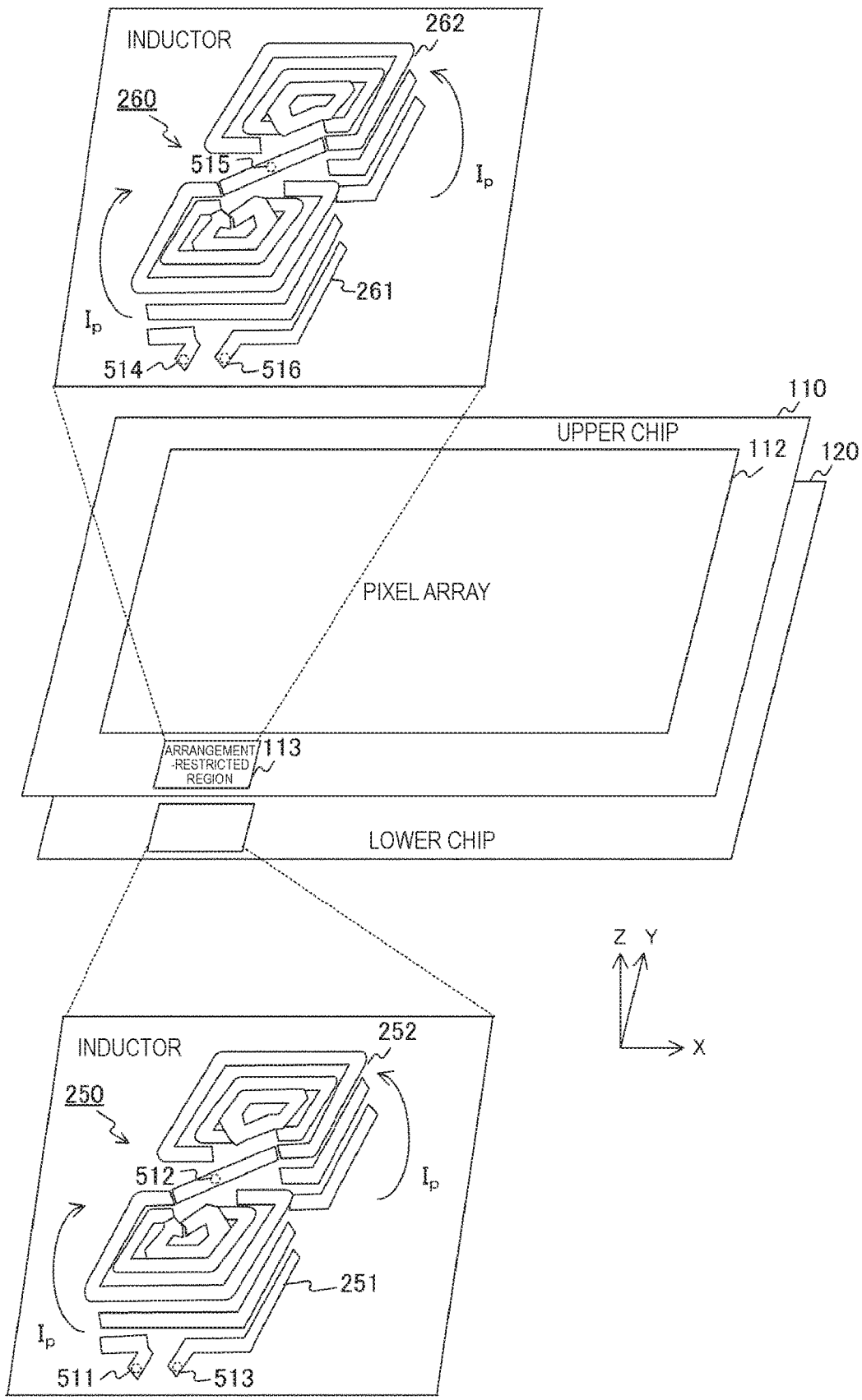
FIG. 12 is an example of a perspective view of a semiconductor device according to the fourth embodiment of the present technology.

FIG. 12 is an example of a perspective view of the semiconductor device 100 according to the fourth embodiment. The semiconductor device 100 according to the fourth embodiment is different from that of the third embodiment in that 8-shaped inductors 250 and 260 are provided instead of the circular inductors 234 and 235. In addition, the fourth semiconductor device 100 is different from the third embodiment in that its configuration is applied to an image sensor.

Figure 13:
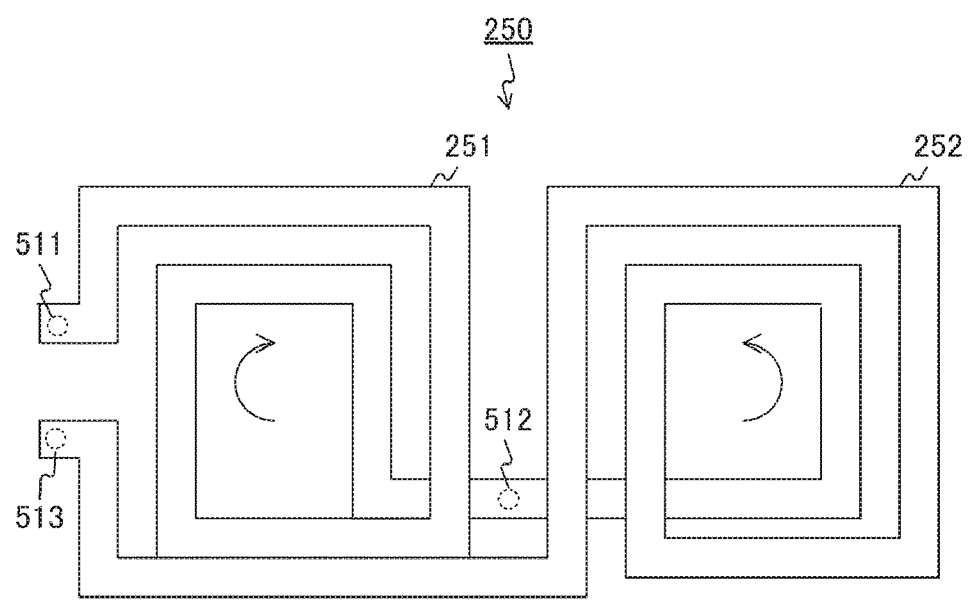
FIG. 13 is an example of a plan view of an inductor according to a fourth embodiment of the present technology.
Figure 13:
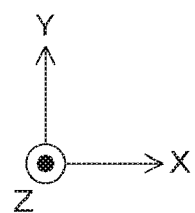

FIG. 13 is an example of a plan view of the inductor 250 according to the fourth embodiment. The inductor 250 includes wiring 251 and 252 that are connected to each other. Here, one of both ends of the wiring 251 that is not connected to the wiring 252 is defined as a start point 511 and the other end is defined as a connection point 512. In addition, one of both ends of the wiring 252 that is not connected to the wiring 251 is defined as an end point 513.

The wiring 251 has multiple layers, and in each layer, the wiring 251 is wound around a central axis parallel to the Z-axis along a spiral path that pivots clockwise from the start point 511 to the connection point 512. Moreover, in FIG. 13, the inductor 250 is a single layer for the convenience of description.

The wiring 252 has also multiple layers, and in each layer, the wiring 252 is wound around a central axis parallel to the Z-axis direction along a spiral path that pivots clockwise from the connection point 512 to the end point 513.

In this way, the wiring 251 and the wiring 252 are wound in opposite directions to each other, so the magnetic fields generated in the respective wiring cancel each other around the inductor 250. Thus, the magnetic field leaking from the inductor 250 weakens, which allows the electromagnetic noise occurring in the logic circuit 115 or the like to be reduced or eliminated.

Moreover, although the planar shape of each of the wiring 241 and 242 is rectangular, it may be circular or elliptical. In addition, although the wiring 241 and 242 are multilayered, they may be a single layer.

The shape of the inductor 260 is similar to that of the inductor 250, and these inductors generate magnetic fields in the same direction along the Z-axis, which is similar to the third embodiment. Thus, similarly to the third embodiment, it is possible to increase the inductance.

In this way, according to the fourth embodiment of the present technology, the 8-shaped inductors 250 and 260 that generate the magnetic field in the same direction are provided, so it is possible to reduce or eliminate the electromagnetic noise and to increase the inductance.

<5. Fifth Embodiment>

In the fourth embodiment described above, although the inductor 250 is arranged in the arrangement-restricted region 113 above the inductor 250, it is possible to arrange a dummy pattern instead of the inductor 260. A semiconductor device 100 according to a fifth embodiment is different from that of the fourth embodiment in that a dummy pattern is arranged instead of the inductor 260.

Figure 14:
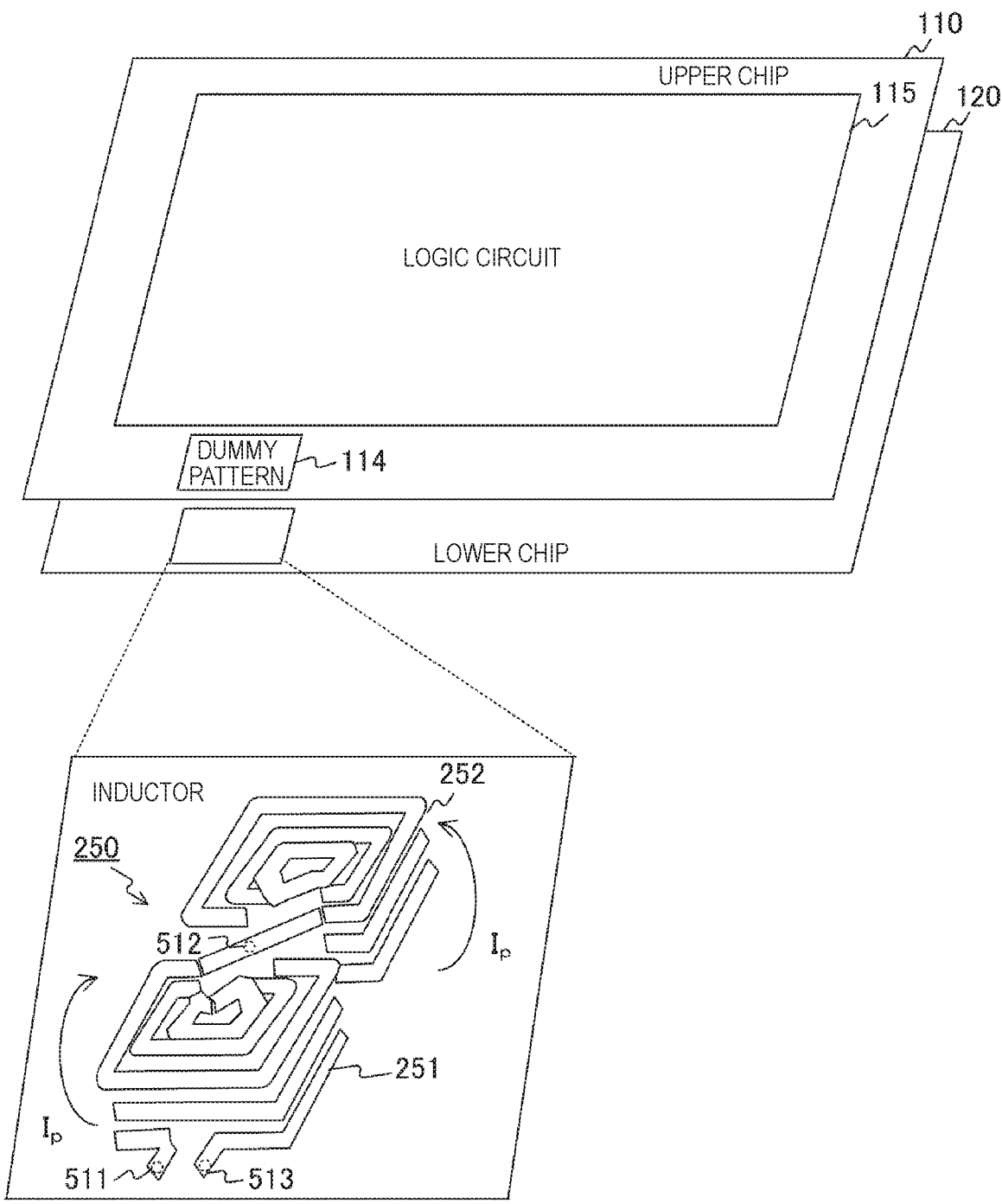
FIG. 14 is an example of a perspective view of a semiconductor device according to the fifth embodiment of the present technology.

FIG. 14 is an example of a perspective view of the semiconductor device 100 according to the fifth embodiment. The semiconductor device 100 according to the fifth embodiment is different from that of the fourth embodiment in that a dummy pattern 114, instead of the inductor 260, is arranged above the inductor 250. In addition, this configuration is different from that of the fourth embodiment in that the configuration is applied to a device other than the image sensor. The dummy pattern 114 makes it possible to inhibit a decrease in the inductance of the inductor 250, similarly to the first embodiment. In addition, the inductor 250 has an 8-shaped shape, so it is possible to reduce or eliminate the electromagnetic noise due to the magnetic field from the inductor 250, similarly to the fourth embodiment.

In this way, according to the fifth embodiment of the present technology, the dummy pattern 114 is arranged in the arrangement-restricted region 113 above the 8-shaped inductor 250, so it possible to inhibit a decrease in the inductance of the inductor 250 and to reduce or eliminate the electromagnetic noise.

<6. Sixth Embodiment>

In the fourth embodiment described above, although the inductors 250 and 260 are arranged in the image sensor, the inductors 250 and 260 can be arranged in a device that is not the image sensor or the like. A semiconductor device 100 according to a sixth embodiment is different from that of the fourth embodiment in that an inductor is provided in a device other than the image sensor.

Figure 15:
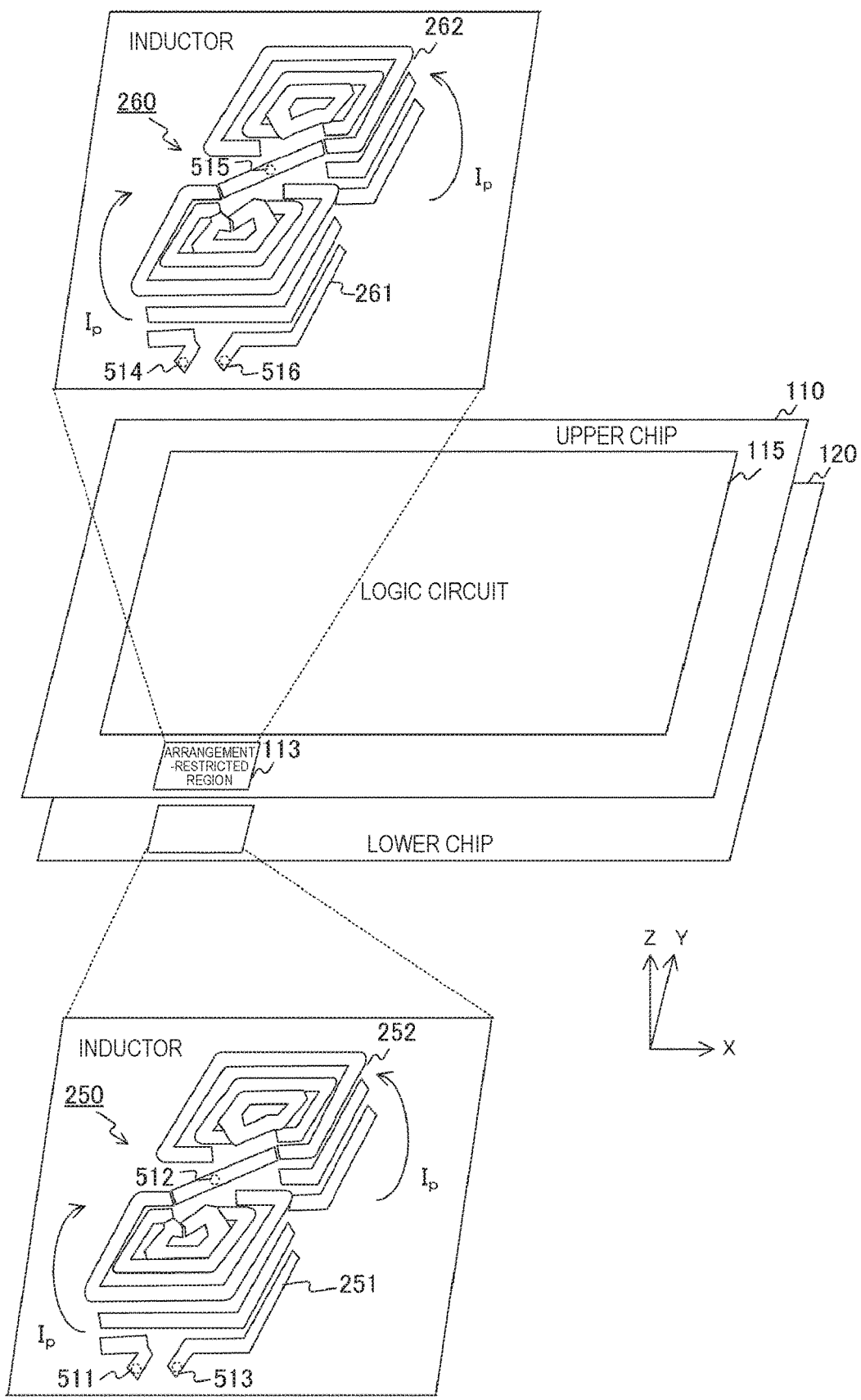
FIG. 15 is an example of a perspective view of a semiconductor device according to the sixth embodiment of the present technology.

FIG. 15 is a block diagram illustrating an exemplary configuration of the semiconductor device 100 according to the sixth embodiment. The semiconductor device 100 according to the sixth embodiment is different from that of the fourth embodiment in that it includes a circuit other than the image sensor.

In this way, according to the sixth embodiment of the present technology, the 8-shaped inductors 250 and 260 are provided in a device other than the image sensor, so, in a device other than the image sensor, it is possible to reduce or eliminate the electromagnetic noise and to increase the inductance.

<7. Seventh Embodiment>

In the fourth embodiment described above, the 8-shaped inductors 250 and 260 are arranged, but instead of such inductors, an inductor having circular or other shape can be arranged. The semiconductor device 100 according to this eighth embodiment is different from that of the fourth embodiment in that an inductor having a different shape from the 8-shaped inductor is arranged.

Figure 16:
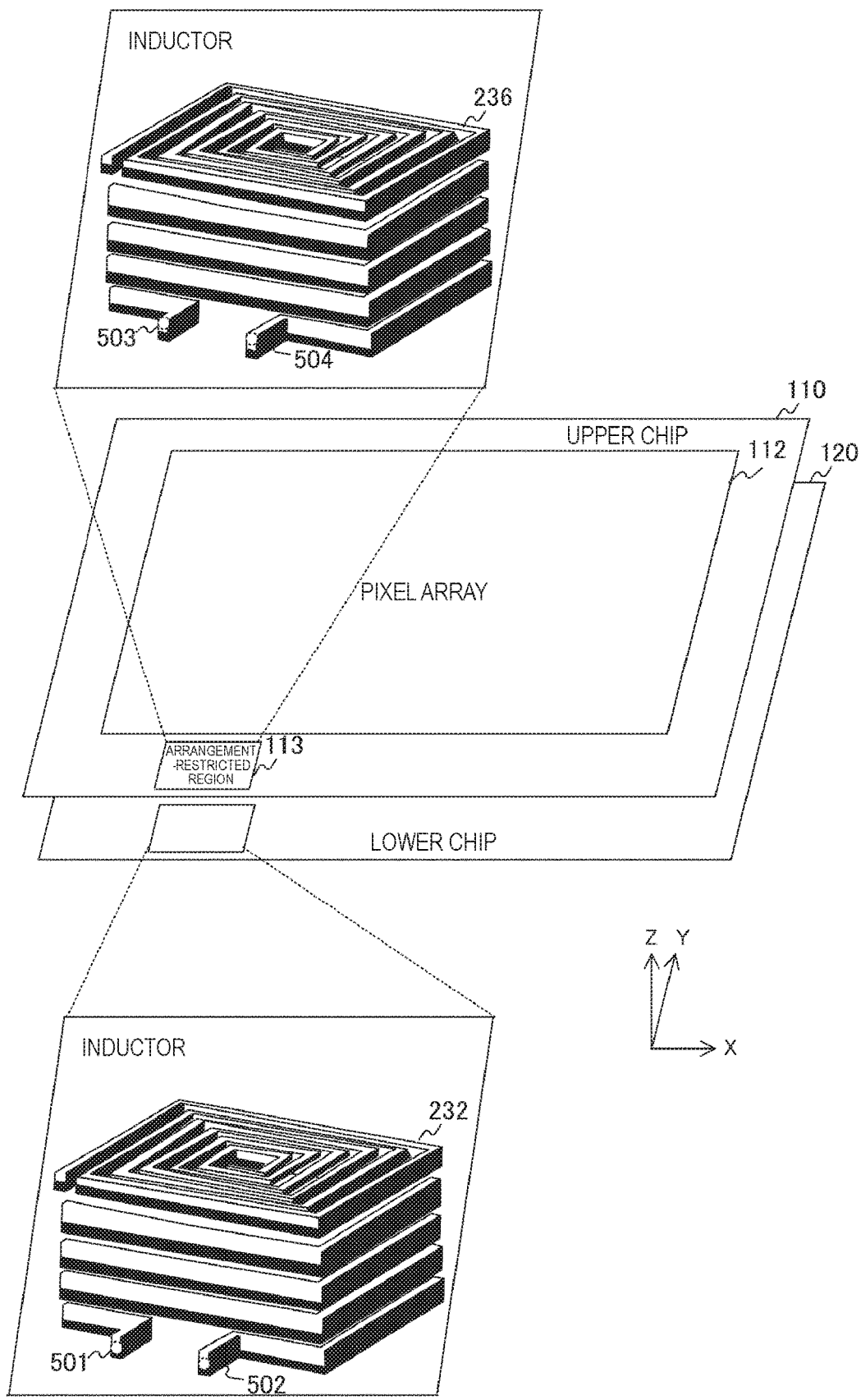
FIG. 16 is an example of a perspective view of a semiconductor device according to the seventh embodiment of the present technology.

FIG. 16 is an example of a perspective view of the semiconductor device 100 according to the seventh embodiment. The semiconductor device 100 according to the seventh embodiment is different from that of the fourth embodiment in that multilayer inductors 232 and 236 are provided instead of the 8-shaped inductors 250 and 260. The configuration of the inductor 236 is similar to that of the inductor 232 according to the first embodiment.

In this way, according to the seventh embodiment, the inductor 236 that generates the magnetic field in the same direction as the inductor 232 is provided above the inductor 232, so it is possible to increase the inductance of the inductor 232.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

FIG. 17 is a view that summarizes combinations of the respective configurations according to the first to seventh embodiments. The semiconductor device 100 can be the image sensor as described in the first embodiment or the like or a device other than the image sensor as described in the second embodiment or the like.

Further, in the arrangement-restricted region 113 above the lower inductor, the dummy pattern as described in the first embodiment or the like can be arranged, or the inductor as described in the third embodiment or the like can be arranged. Alternatively, as described in the modification of the first embodiment, it may be possible to have the configuration in which a component or circuit is not arranged.

Further, the inductor can be a circular shape, a rectangular shape, or the like as described in the first embodiment or the like, or can be an 8-shaped shape as described in the third embodiment and the like. In addition, the inductor can be a single layer as described in the second embodiment or the like, or can be multilayered as described in the first embodiment or the like.

Note that the effects described in this specification are construed as merely illustrative and not limitative, and other effects may be achieved.

Additionally, the present technology may also be configured as below.

(1)

A semiconductor device including:

first and second semiconductor chips that are stacked;

a first inductor arranged in the first semiconductor chip;

an arrangement-restricted region provided in a region of the second semiconductor chip corresponding to the first inductor; and a circuit arranged in a region of the second semiconductor chip not corresponding to the arrangement-restricted region.

(2)

The semiconductor device according to (1), further including:

a dummy pattern including wiring of a predetermined pattern insulated from the circuit, in which the dummy pattern is arranged in the arrangement-restricted region.

(3)

The semiconductor device according to (1), further including:

a second inductor connected to the first inductor, in which the first and second inductors generate individual magnetic fields in an identical direction, and the second inductor is arranged in the arrangement-restricted region.

(4)

The semiconductor device according to (3), in which the second inductor includes wiring wound along a spiral path.

(5)

The semiconductor device according to (3), in which the second inductor includes first wiring wound clockwise from a predetermined start point to a predetermined connection point, and second wiring wound counterclockwise from the predetermined connection point to a predetermined end point.

(6)

The semiconductor device according to any of (3) to (5), in which the second inductor includes multilayer wiring.

(7)

The semiconductor device according to any of (1) to (6), in which the first inductor includes wiring wound along a spiral path.

(8)

The semiconductor device according to any of (1) to (6), in which the first inductor includes first wiring wound clockwise from a predetermined start point to a predetermined connection point, and second wiring wound counterclockwise from the predetermined connection point to a predetermined end point.

(9)

The semiconductor device according to any of (1) to (8), in which the first inductor includes multilayer wiring.

(10)

The semiconductor device according to any of (1) to (9), further including:

a capacitor configured to resonate with the first inductor.

(11)

The semiconductor device according to any of (1) to (10), in which the circuit includes a plurality of pixel circuits each of which generates a pixel signal.

(12)

A semiconductor chip including:

an arrangement-restricted region provided in a region corresponding to a first inductor arranged in another semiconductor chip that is stacked; and a circuit arranged in a region not corresponding to the arrangement-restricted region.

(13)

A system including:

first and second semiconductor chips that are stacked;

a first inductor arranged in the first semiconductor chip;

an arrangement-restricted region provided in a region of the second semiconductor chip corresponding to the first inductor; and a circuit arranged in a region of the second semiconductor chip not corresponding to the arrangement-restricted region.

REFERENCE SIGNS LIST 100 semiconductor device
110 upper chip
111 vertical scanning circuit
112 pixel array
113 arrangement-restricted region
114 dummy pattern
115, 125 logic circuit
120 lower chip
121 timing control circuit
122 horizontal scanning circuit
123 image signal processor
130 column ADC
131 comparator unit
132 counter
200 phase-locked loop
210 phase comparator
220 charge pump
230 voltage-controlled oscillator
231 variable capacitor
232, 234, 235, 236, 250, 260 inductor
233 amplifier circuit
240 frequency divider

The invention claimed is:

1. A semiconductor device, comprising:

a first semiconductor chip; and a second semiconductor chip stacked on the first semiconductor chip;

a first inductor in the first semiconductor chip, wherein the first inductor is configured to generate a magnetic field;

an arrangement-restricted region in a first region of the second semiconductor chip corresponding to the first inductor, wherein the arrangement-restricted region is configured to inhibit generation of a magnetic field in a direction opposite to the magnetic field generated by the first inductor; and a circuit in a second region of the second semiconductor chip different from the arrangement-restricted region of the second semiconductor chip, wherein the circuit includes a plurality of pixel circuits, and each pixel circuit of the plurality of pixel circuits is configured to generate a pixel signal.

2. The semiconductor device according to claim 1, further comprising a dummy pattern including wiring of a determined pattern insulated from the circuit, wherein the dummy pattern is in the arrangement-restricted region.

3. The semiconductor device according to claim 1, further comprising a second inductor connected to the first inductor, wherein the first inductor and the second inductor generate individual magnetic fields in an identical direction, and the second inductor is in the arrangement-restricted region.

4. The semiconductor device according to claim 3, wherein the second inductor includes a wiring wound along a spiral path.

5. The semiconductor device according to claim 3, wherein the second inductor includes:
- a first wiring wound in a clockwise direction from a determined start point to a determined connection point; and
- a second wiring wound in a counterclockwise direction from the determined connection point to a determined end point.

6. The semiconductor device according to claim 3, wherein the second inductor includes a multilayer wiring.

7. The semiconductor device according to claim 1, wherein the first inductor includes a wiring wound along a spiral path.

8. The semiconductor device according to claim 1, wherein the first inductor includes:
- a first wiring wound in a clockwise direction from a determined start point to a determined connection point, and
- a second wiring wound in a counterclockwise direction from the determined connection point to a determined end point.

9. The semiconductor device according to claim 1, wherein the first inductor includes a multilayer wiring.

10. The semiconductor device according to claim 1, further comprising a capacitor configured to resonate with the first inductor.

11. A first semiconductor chip, comprising:
an arrangement-restricted region in a first region, wherein
the first region corresponding to an inductor in a second semiconductor chip,
the first semiconductor chip is stacked on the second semiconductor chip,
the inductor generates a magnetic field, and
the arrangement-restricted region is configured to inhibit generation of a magnetic field in a direction opposite to the magnetic field generated by the inductor; and a circuit in a second region of the first semiconductor chip different from the arrangement-restricted region of the first semiconductor chip, wherein
the circuit includes a plurality of pixel circuits, and
each pixel circuit of the plurality of pixel circuits is configured to generate a pixel signal.

12. A system, comprising:
a first semiconductor chip;
a second semiconductor chip stacked on the first semiconductor chip;
an inductor in the first semiconductor chip, wherein the inductor is configured to generate a magnetic field;
an arrangement-restricted region in a first region of the second semiconductor chip corresponding to the inductor, wherein the arrangement-restricted region is configured to inhibit generation of a magnetic field in a direction opposite to the magnetic field generated by the inductor; and
a circuit in a second region of the second semiconductor chip different from the arrangement-restricted region of the second semiconductor chip, wherein
the circuit includes a plurality of pixel circuits, and
each pixel circuit of the plurality of pixel circuits is configured to generate a pixel signal.

13. A semiconductor device, comprising:
a first semiconductor chip;
a second semiconductor chip stacked on the first semiconductor chip;
an inductor in the first semiconductor chip;
an arrangement-restricted region in a first region of the second semiconductor chip corresponding to the inductor; and
a circuit in a second region of the second semiconductor chip not corresponding to the arrangement-restricted region of the second semiconductor chip, wherein
the circuit includes a plurality of pixel circuits, and
each pixel circuit of the plurality of pixel circuits is configured to generate a pixel signal.

* * * * *